US005594851A

United States Patent [19]
Lange et al.

[11] Patent Number: 5,594,851
[45] Date of Patent: Jan. 14, 1997

[54] METHOD OF SIMULTATING AT LEAST ONE COMPONENT WHOSE CHARACTERIZING FEATURES ARE DESCRIBED BY A SET OF PAIRS OF VALUES, BY MEANS OF A SIMULATOR ON A COMPUTER

[75] Inventors: Eberhard Lange, Obermichelbach; Haible Jürgen, Erlangen Tennenlohe, both of Germany

[73] Assignee: Siemens Aktiengesellschaft, Munich, Germany

[21] Appl. No.: 379,505

[22] PCT Filed: Jul. 16, 1993

[86] PCT No.: PCT/EP93/01875

§ 371 Date: Jan. 30, 1995

§ 102(e) Date: Jan. 30, 1995

[87] PCT Pub. No.: WO94/03867

PCT Pub. Date: Feb. 17, 1994

[30] Foreign Application Priority Data

Jul. 31, 1992 [EP] European Pat. Off. .............. 92113107

[51] Int. Cl.⁶ .................................................. G06F 15/00
[52] U.S. Cl. ........................................................ 395/140
[58] Field of Search ................................... 395/140, 133, 395/142; 345/133, 134

[56] References Cited

U.S. PATENT DOCUMENTS 5,047,971  9/1991  Horwitz ................................. 364/578

OTHER PUBLICATIONS

Kahaner, "Numerical Methods and Software", pp. 108–113, 1989, Prentice Hall.

"A Table Model For Circuit Simulation", Klaus–Georg Rauh, 12th European Solid State Circuits Conference (1986), pp. 211–213.

"Automatic Tension Adjustment for Interpolatory Splines", Yates Fletcher, IEEE Computer Graphics and Applications, vol. 10, No. 1, Jan. 1990, pp. 10–17.

H. Stump (Logic Modeling Systems Incorporated): Trends in Technology and EDA for the 1990's, in: Conference Record Electro/90, Ventura, USA, 1990, pp. 335–341.

B. Tuck: What Do Digital Designers Need to Master the Art of Analog Design, in: Computer Design, Aug. 1991, pp. 92–106.

*Primary Examiner*—Phu K. Nguyen
*Attorney, Agent, or Firm*—Hill, Steadman & Simpson

[57] ABSTRACT

With the invention, a method is described which permits a DV-based setting up of models for simulators. A prescribed set of data pairs, in the form in which it can for example be taken from a data sheet, is automatically interpolated. "Kinks" and extreme points in the function curves can be explicitly prescribed. Using the method according to the invention, shorter simulation times are possible and said method gives more precise results.

4 Claims, 5 Drawing Sheets

METHOD OF SIMULTATING AT LEAST ONE COMPONENT WHOSE CHARACTERIZING FEATURES ARE DESCRIBED BY A SET OF PAIRS OF VALUES, BY MEANS OF A SIMULATOR ON A COMPUTER

BACKGROUND OF THE INVENTION

The invention relates to a method by which components, such as for example electronic analog components, or mechanical components can be simulated on a computer-based simulator, more rapidly and precisely than hitherto usual.

During recent years, the simulation of electronic components has developed in to an important topic. It is constantly emphasized that the simulation can above all improve the quality of the developed circuits and leads to an increase in productivity (H. Spiro: Simulation of Integrated Circuits by Universal Computer Programs, R. Oldenbourg, Verlag GmbH, Munich, 1985); (H. Wiedemann (Racal Redac Design System GmbH): Superordinate Aspects in the ASIC Design in: Meeting Reports SMT/ASIC/Hybrid '91, 5th International Trade Fair and Congress, VDE Verlag, Berlin, 1991); and (H. Stump (Logic Modeling Systems Incorporated): Trends in Technology and EDA for the 1990s, in: Conference Record Electro/90, Ventura, USA, 1990). However, the extent to which simulation has become widespread is relatively small, above all in the case of the development of circuit board assemblies. The reasons for this are both of an organizational and also of a technical nature.

One of the technical obstacles in simulation—both on the digital and also on the analog side—is the absence of suitable models (H. Stump (Logic Modeling Systems Incorporated): Trends in Technology and EDA for the 1990s, in: Conference Record Electro/90, USA, 1990). While in the case of digital simulation what is involved is the logical and temporal description of a component element using a corresponding programing language, analog simulation comprises the conversion of prescribed measurement curves in to mathematical equations, which must be formulated with the aid of a modeling language. Although at the present time no standard can be identified in the field of analog modeling languages, the majority of simulators do nevertheless offer at least the possibility of the input of mathematical function equations. Accordingly, the problem of the modeling is essentially reduced to obtaining such equations.

The requirements imposed on mathematical equations which are intended to describe the physical behavior of a component are divided in to two groups of demands: on the one hand, the physical behavior is to be described as precisely as possible. In the case of electronic components, the theory frequently also delivers differing description functions for differing working sectors. In most cases, it is not possible to describe a component over the entire working range, even with only one function. On the other hand, the models are to be as efficient as possible, and the simulator must therefore be able to process them rapidly. The more complicated are the functional descriptions, the more slowly the simulation runs. Specifically in the case of the complex circuits which are of particular interest for simulation, the factor "simulation time" plays a decisive role.

SUMMARY OF THE INVENTION

The object underlying the invention consists in specifying a method for simulating at least one component, which operates more rapidly and more precisely than hitherto usual methods.

This object is achieved in accordance with method for simulating at least one component, whose characterizing features are described by a set of pairs of values (A, V) by means of a simulator on a computer. In a first step, a function (s) is found by spline interpolation for all pairs of values (A, V) which function allocates in each instance to the one vlaue (A, V) of each respective pair of values the other value (V, A) of the pair of vlaues. In a second step, the function found is used in the simulator to determine arbitrarily selectable pairs of values (A, V) for the component. A non-differentiable point (D) in the progression of the function is generated in that the set of pairs of values is subdivided in to two subsets, in which the point is included. The spline interpolation is carried out for each subset, the point being used on one occasion as upper interval bound and on the other occasion as lower interval bound related to the two subsets for the spline interpolation.

All remaining further developments of the invention are as follows.

It is also a method of the present invention to simulate at least one component, whose characterizing features are described by a set of pairs of values (A, V), by means of a simulator on a computer. This method has the following steps:

a) in a first step, a function (s) is found by spline interpolation for all pairs of values (A, V) which function allocates in each instance to the one value (A, V) of each respective pair of values the other value (V, A) of the pair of values;

b) for the spline interpolation a cubic spline function of the form:

$$s(x) = a_{i,3} \cdot (x-x_i)^3 + a_{i,2} \cdot (x-x_i)^2 + a_{i,1} \cdot (x-x_i) + a_{i,0}$$

is used, with pairs of values $(x_i, y_i)$, $i=1, \ldots, n$ where $n \in N$ which are sorted in ascending sequence according to the magnitude of $x_i$ and form the interval bounds of the partial intervals for the spline interpolation;

c) the coefficients $a_{i,3}$, $a_{i,2}$, $a_{i,0}$ for each partial interval are determined as $$a_{i,0} = y_i$$

$$a_{i,1} = s'(x_i)$$

$$a_{i,2} = \frac{1}{2} \cdot s''(x_i)$$

$$a_{i,3} = \frac{s''(x_{i+1}) - s''(x_i)}{6 \cdot (x_{i+1} - x_i)}$$

with the recursion formulae $$s'(x_{i+1}) = 3 \cdot \Delta^i - \frac{1}{2} s''(x_i) \cdot \Delta_x^i - 2 \cdot s'(x_i)$$

$$s''(x_{i+1}) = 6 \frac{\Delta^i}{\Delta_x^i} - 2 \cdot s''(x_i) - 6 \frac{s'(x_i)}{\Delta_x^i}$$

-continued $$\Delta_x^i := x_{i+1} - x_i$$

$$\Delta_y^i := y_{i+1} - y_i$$

$$\Delta_i := \frac{\Delta_y^i}{\Delta_x^i}$$

with the use of $$s'(x_i) = c_i \cdot s'(x_1) + e_i$$

$$s''(x_i) = \check{c}_i \cdot s'(x_1) + \check{e}_i$$

$$c_{i+1} = -\frac{1}{2}\Delta_x^i \cdot \check{c}_i - 2 \cdot c_i$$

$$e_{i+1} = 3 \cdot \Delta^i - \frac{1}{2}\Delta_x^i \cdot \check{e}_i - 2 \cdot e_i$$

$$\check{c}_{i+1} = -2 \cdot \check{c}_i - 6\frac{c_i}{\Delta_x^i}$$

$$\check{e}_{i+1} = 6\frac{\Delta^i}{\Delta_x^i} - 2 \cdot \check{e}_i - 6\frac{e_i}{\Delta_x^i}$$

the initial conditions for natural splines $$c_1 = 1$$

$$e_1 = 0$$

$$\check{c}_1 = 0$$

$$\check{e}_1 = s''(x_1) = 0$$

as well as the boundary conditions for natural splines $$s''(x_1) = 0 \text{ and } s''(x_n) = 0$$

and the derivative determined therefrom $$s'(x_i) = -\frac{\check{e}_n}{\check{c}_n}$$

Index "'" signifies 1st derivative
Index "''" signifies 2nd derivative; and d) in a second step, the function found is used in the simulator to determine arbitrarily selectable pairs of values (A, V) for the component.

A further development of this method is as follows:

a) a non-differentiable point (D) in the progression of the function is generated in that the set of pairs of values is subdivided into two subsets in which the point is included; and b) the spline interpolation is carried out for each subset, the point being used on one occasion as upper interval bound and on the other occasion as lower interval bound related to the two subsets for the spline interpolation.

Another further development of this method in which extreme points (E) are prescribed for the function, the coefficients a are determined using the same recursion formulae in the following manner:

a) for $x_1$ as extreme point with the use of:

$$s'(x_i) = c_i \cdot s''(x_1) + e_i$$

$$s''(x_1) = \check{c}_1 \cdot s''(x_1) + \check{e}_1$$

as well as the extreme value conditions $$s'(x_1) = 0 \text{ and } s''(x_n) = 0$$

and the initial conditions $$c_1 = 0$$

$$e_1 = s'(x_1) = 0$$

$$\check{c}_1 = 1$$

$$\check{e}_1 = 1$$

and the 2nd derivative determined therefrom $$s''(x_1) = -\frac{\check{e}_n}{\check{c}_n}$$

b) for $x_n$ as extreme point, with the use of:

$$s'(x_n) = c_n \cdot s'(x_1) + e_n$$

as well as the extreme value conditions:

$$s''(x_1) = 0 \text{ and } s'(x_n) = 0$$

and the derivative determined therefrom $$s'(x_1) = -\frac{e_n}{c_n}$$

c) for $x_1$ and $x_n$ as extreme points, with the use of $$s'(x_n) = c_n \cdot s''(x_1) + e_n$$

as well as the extreme value conditions $$s'(x_1) = 0 \text{ and } s'(x_n) = 0$$

the initial conditions $$c_1 = 0$$

$$e_1 = s'(x_1) = 0$$

$$\check{c}_1 = 1$$

$$\check{e}_1 = 0$$

and the 2nd derivative determined therefrom $$s''(x_1) = -\frac{e_n}{c_n}$$

In the first instance, the mathematical principles which are relevant for the modeling are described. Subsequently, the method invented by us is presented. Following this, the performance is demonstrated with reference to a practical example (current-limiter diode F452).

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Mathematical Principles

Prerequisites

We proceed on the basis of the fact that the physical behavior of a component is graphically prescribed in the form of a function f. From the graph of the function, it is possible to derive data points $(x_i, y_i)$, $i=1, \ldots, n$ where $n \in N$ and $y_i = f(x_i)$. The aim is to describe these data points in the curve progression, lying therebetween, of the function f by mathematical functions as well as possible.

Let $n \in N$, $M := \{1, 2, \ldots, n\}$. Let $a,b \in R$ where $a<b$. Let $(x_i)_{i \in M}$ be a real, increasing family with $x_1 = a$, $x_n = b$, let $(y_i)_{i \in M}$ be a real family. In the circumstances, the partitioning of the interval $I := [a,b]$ is understood to be the set of partial intervals $I_i$, $i \in M/\{n\}$, where $I_i := [x_i, x_{i+1}]$. The family $(x_i, y_i)_{i \in M}$ is also designated as the set of data points D.

Let $m \in N$. Then $C^m[I]$ designates the set of the functions which are continuously differentieble m times with respect to I.

Splines

Let $I := [a,b]$ an interval with an associated partitioning. A spline of degree m ($m \in N$) is understood to be a function defined with respect to $I: s: I \to R$, $x \to s(x)$ with the following additional properties:

(i) $s \in C^{m-1}[I]$ (ii) On each partial interval $I_i$, s is a polynomial at most of degree m.

The property (i) means that a spline of degree m is continuously differentiable (m-1) times.

A spline is referred to as the cubic spline if its degree is $m=3$. Thus, a cubic spline is continuously differentiable twice and is, on each partial interval $I_i$, a polynomial of at most the third degree.

A spline is referred to as an interpolating spline for the partitioning $I_i$ and for the set of data points D if the following is applicable:

$$s(x_i) = y_i \text{ for } i=1, \ldots, n \quad (2.1)$$

Cubic interpolating splines are simply referred to as splines hereinbelow.

Existence and Uniqueness of the Splines

Let $I := [a,b]$ again be an interval with an associated partitioning. Let the following be applicable: $f \in C^2[I]$, s: $I \to R$ spline. If s satisfies one of the following conditions, then s is uniquely determined:

(i) $s''(a) = s''(b) = 0$ (ii) $s'(a) = f'(a)$ and $s'(b) = f'(b)$ \quad (2.2)

In the case (i), s is also designated as a natural spline. In the case (ii), it is presumed that the derivatives of the function f are known at the marginal points a,b.

Practical Consequences of the Interpolation with Splines

Since $s \in C^2[I]$, it follows in particular that at the data points the following is applicable:

$$s(x_i^+) = s(x_i^-) = y_i \text{ for } i=1, \ldots, n \quad (2.3)$$

$$s'(x_i^+) = s'(x_i^-) \text{ for } i=2, \ldots, n-1 \quad (2.4)$$

and $$s''(x_i^+) = s''(x_i^-) \text{ for } i=2, \ldots, n-1 \quad (2.5)$$

In this case, $s(x_i^+)$ designates the function value of the spline which is given by the representative third order polynomial in the partial interval $[x_i, x_{i+1}]$ at the position $x_i$. Similarly, $s(x_i^-)$ designates the function value of the polynomial in the partial interval $[x_{i-1}, x_i]$ at the position $x_i$.

Thus, the data points $(x_i, y_i)_{i \in M}$ are interpolated by a twice continuously differentiable function. The data points lie explicitly on the graph of the function. In particular, the result is a smooth curve, which possesses no "jumps" (discontinuities) or "kinks" (non-differentiable positions).

The second derivative $s''(x)$ of the spline is a linear polynomial on each partial interval.

Minimum Property of the Splines

The set of functions which are continuously differentiable on the interval I and whose second derivative exists almost everywhere and is quadratically Lebesgue integrable, is designated by $H^2[I]$. For functions $f \in H^2[I]$ it is accordingly possible to define the semi norm $$\|f\| := \sqrt{\int_a^b |f''(x)|^2 \, dx}$$

$|f''(x)|$ is a measure of the curvature behavior of f at the position x. The curvature in the root mean square is thus specifically given by $\|f\|$.

The minimum property of the splines now states that the natural spline s of all functions $f \in C^2[I]$, for which $f(x_i) = y_i$ applies for $i=1, \ldots, n$, gives the smallest possible value for the curvature in the root mean square. In this sense, the spline is accordingly the smoothest interpolating function for the given data points.

Convergence Property of the Splines

Splines converge to the function which they interpolate if the partitionings $I_i$ are selected progressively more finely. This applies in contrast to interpolation using customary polynomials. In the case of interpolation with splines, there is accordingly no restriction, on fundamental grounds, in the attainable accuracy of the interpolation.

Spline Algorithms as Matrix Equations

The systematic evaluation of the conditions set out in subsections 2.2 and 2.3 leads to matrix equations which can be solved with the aid of algorithms for linear systems of equations (for further details, see [4]).

Arc Length of Splines

The arc length of an arbitrary function, ie in particular of the spline s, is given by $$b(s) = \int_a^b \sqrt{1 + (s'(x))^2} \, dx \tag{2.6}$$

This integral may indeed in principle be explicitly computed [6]; however, this is very tedious. In the specific computation, recourse is therefore had to numerical methods (see for example [4]).

DESCRIPTION OF THE ALGORITHMS

Prerequisites

The data points are in practice in most cases obtained from a function curve prescribed on a data sheet. Such physical curves frequently include, at least in terms of appearance, "kinks" which to a first approximation can be regarded as non-differentiable points. This is the case, for example, with the characteristic of a diode (breakdown voltage). Therefore, the possibility of non-differentiable points is explicitly provided in the algorithms described here. Further significant points which can be taken from a data sheet are relative maxima and minima. The possibility of defining specified points explicitly as extreme values is likewise provided in our algorithms.

Closed Spline Algorithm

The interpolation with splines may also be formulated without the use of matrices as algorithm. In this subsection, the core element of our algorithms is formulated as a matrix-independent natural spline interpolation. The algorithm is autonomous, and in particular no matrices are used.

The spline in the partial interval $I_i$ may be written as $$s(x) = a_{i,3} \cdot (x-x_i)^3 + a_{i,2} \cdot (x-x_i)^2 + a_{i,1} \cdot (x-x_i) + a_{i,0} \tag{3.1}$$

where $i \in M/\{n\}$ with $n>1$.

The objective of the algorithm is therefore the determination of the coefficients $a_{i,0}$, $a_{i,1}$, $a_{i,2}$ and $a_{i,3}$ in each partial interval. For $n<2$ (partial interval with fewer than two points) the algorithm is not applicable and is interrupted by an error. Likewise, data points whose ordinates are not arranged in ascending sequence ($x_j \geq x_{j+1}$) lead to an error and interruption.

The following is obtained by differentiation of (3.1):

$$s'(x) = 3 \cdot a_{i,3} \cdot (x-x_i)^2 + 2 \cdot a_{i,2} \cdot (x-x_i) + a_{i,1}$$

$$s''(x) = 6 \cdot a_{i,3} \cdot (x-x_i) + 2 \cdot a_{i,2} \tag{3.2}$$

The following is obtained from (3.1) and (3.2):

$$s(x_i) = a_{i,0}$$

$$s'(x_i) = a_{i,1}$$

$$s''(x_i) = 2 \cdot a_{i,2}$$

$$s''(x_{i+1}) = 6 \cdot a_{i,3} \cdot (x_{i+1} - x_i) + 2 \cdot a_{i,2}$$

Solution of these equations for the coefficients gives $\forall i \in M/\{n\}$:

$$\begin{aligned} a_{i,0} &= y_i \\ a_{i,1} &= s'(x_i) \\ a_{i,2} &= 1/2 \cdot s''(x_i) \\ a_{i,3} &= \frac{s''(x_{i+1}) - s''(x_i)}{6 \cdot (x_{i+1} - x_i)} \end{aligned} \tag{3.3}$$

The first and second derivatives $s'(x_i)$ and $s''(x_i)$ can be computed by an iterative method. To this and, in the first instance differences $\Delta_x^i$, $\Delta_y^i$ and difference quotients $\Delta^i$ are defined:

$$\Delta_x^i := x_{i+1} - x_i$$

$$\Delta_y^i := y_{i+1} - y_i$$

$$\Delta^i := \frac{\Delta_y^i}{\Delta_x^i} \tag{3.4}$$

With the aid of the equations (3.1) and (3.2), the following is obtained:

$$s(x_{i+1}) = a_{i,3} \cdot (\Delta_x^i)^3 + a_{i,2} \cdot (\Delta_x^i)^2 + a_{i,1} \cdot \Delta_x^i + a_{i,0}$$

$$s'(x_{i+1}) = 3 \cdot a_{i,3} \cdot (\Delta_x^i)^2 + 2 \cdot a_{i,2} \cdot \Delta_x^i + a_{i,1}$$

$$s''(x_{i+1}) = 6 \cdot a_{i,3} \cdot \Delta_x^i + 2 \cdot a_{i,2} \tag{3.5}$$

In this case, the results for $a_{i,2}$, $a_{i,1}$ and $a_{i,0}$ from the equations (3.3) can be used:

$$s(x_{i+1}) = a_{i,3} \cdot (\Delta_x^i)^3 + \tfrac{1}{2} s''(x_i) \cdot (\Delta_x^i)^2 + s'(x_i) \cdot \Delta_x^i + y_i \tag{3.6}$$

$$s'(x_{i+1}) = 3 \cdot a_{i,3} \cdot (\Delta_x^i)^2 + s''(x_i) \cdot \Delta_x^i + s'(x_i)$$

$$s''(x_{i+1}) = 6 \cdot a_{i,3} \cdot (\Delta_x^i) + s''(x_i) \tag{3.7}$$

With $s(x_{i+1}) = Y_{i+1}$, (3.6) gives the following:

$$\Delta_y^i = a_{i,3} \cdot (\Delta_x^i)^3 + \tfrac{1}{2} s''(x_i) \cdot (\Delta_x^i)^2 + s'(x_i) \cdot (\Delta_x^i)$$

Solving $a_{i,3}$ now gives:

$$a_{i,3} = \frac{\Delta_y^i}{(\Delta_x^i)^3} - \frac{s''(x_i)}{2 \cdot \Delta_x^i} - \frac{s'(x_i)}{(\Delta_x^i)^2} \tag{3.8}$$

If equation (3.8) is substituted in equations (3.7), then this gives iterative equations for the first and second derivatives $s'(x_i)$ and $s''(x_i)$:

$$s'(x_{i+1}) = 3 \cdot \Delta^i - 1/2 s''(x_i) \cdot \Delta_x^i - 2 \cdot s'(x_i) \tag{3.9}$$

$$s''(x_{i+1}) = 6 \frac{\Delta^i}{\Delta_x^i} - 2 \cdot s''(x_i) - 6 \frac{s'(x_i)}{\Delta_x^i}$$

With the aid of the equations (3.9), to the extent that the values for $s'(x_1)$ and $s''(x_1)$ are known, all first and second derivatives at their base points can be computed and thus, via the equations (3.3) all coefficients of the spline can also be computed.

In the case of a natural spline (see equation (2.2)) not $s'(x_1)$ and $s''(x_1)$ are prescribed, but $s''(x_1) = 0$ and $s''(x_n) = 0$. The iterative equations (3.9) may be written as $$S'(x_i) = c_i \cdot s'(x_1) + e_i$$

$$S''(x_i) = \check{c}_i \cdot s'(x_1) + \check{e}_i \tag{3.10}$$

where $$c_{i+1} = -1/2\Delta_x^i \cdot \check{c}_i - 2 \cdot c_i \quad (3.11)$$

$$e_{i+1} = 3 \cdot \Delta^i - 1/2\Delta_x^i \cdot \check{e}_i - 2 \cdot e_i$$

$$\check{c}_{i+1} = -2 \cdot \check{c}_i - 6\frac{c_i}{\Delta_x^i} \quad (3.12)$$

$$\check{e}_{i+1} = 6\frac{\Delta^i}{\Delta_x^i} - 2 \cdot \check{e}_i - 6\frac{e_i}{\Delta_x^i}$$

Applying the initial conditions (natural spline):

$c_1$–1

$e_1 = 0$ $\check{c}_1 = 0$ $$\check{e}_1 = s''(x_1) = 0 \quad (3.13)$$

It is possible to demonstrate the equivalence of the equations (3.10) to (3.13) with (3.9) by incomplete induction with respect to i (see annex B).

For i=n, it emerges from equation (3.10) that $$s''(x_n) = \check{c}_n \cdot s'(x_1) + \check{e}_n$$

Solving for $s'(x_1)$ gives, for the case of a natural spline $$s'(x_i) = -\frac{\check{e}_n}{\check{c}_n} \quad (3.14)$$

The case where $\check{c}_n = 0$ is in this case excluded, since $c_i$ and $\check{c}_i$ in each instance in pairs, are greatly positive or greatly negative (alternating with i). The successive application of the equations (3.4), (3.13), (3.12), (3.14), (3.9) and (3.3) represents a closed algorithm for the computation of the coefficients $a_{i,0}$, $a_{i,1}$, $a_{i,2}$ and $a_{i,3}$ of the spline in each partial interval $I_i$ ($i \in M/\{n\}$).

Treatment of Non-Differentiable Points

If the function curve is to include explicitly non-differentiable points, then this may be achieved very simply by the proportionment of the set of data points $D=\{(x_i,y_i), i \in M\}$ in to a plurality of subsets: let $x_j$ with $j \in M$ be a non-differentiable position, then definition takes place of subsets $M_1 := \{1, \ldots ,j\}$ and $M_2 := \{j, \ldots ,n\}$ of the set M and application takes place of the algorithm described in section 3.2 separately to the sets of data points $D_1 := \{(x_i,y_i), i \in M_1\}$ and $D_2 := \{(x_i,y_i), i \in M_2\}$.

Let $s_1$ now be the (natural) spline for the set of data points $D_1$ and $s_2$ be the (natural) spline for the set of data points $D_2$. Then, according to equation (2.1) it is in particular true that $$s_1(x_j) = s_2(x_j) = y_j$$

The function described by the two splines is therefore, now just as previously, continuous over the entire interval, especially at the position $x_j$. However, in general, $$s'_1(x_j) \neq s'_2(x_j)$$

will be true, that is to say the function is no longer differentiable at the position $x_j$. The curve progression therefore exhibits a "kink".

If a plurality of non-differentiable points are present, then in a similar way a further division into subsets can be undertaken.

Treatment of Extreme Points

In the case of the occurrence of explicitly prescribed extreme points, a division of the set of data points into subsets is undertaken as in section 3.4. The condition for an extreme point at the position $x_j$, $j \in M$ is the following $$s'(x_i) = 0 \quad (3.15)$$

The equation (3.15) represents an additional demand on the (natural) spline; it is accordingly determined on a redundant basis. In the text which follows, a description is given of the manner in which other requirements of the spline to satisfy the equation (3.15) are dropped and the manner in which the algorithm described in section 3.3 is modified.

Let $U=\{(x_i,y_i), i \in \tilde{M}\}$, $\tilde{M}=\{j_1, \ldots, j_2\}$ where $j_1, j_2 \in N$ be a subset of D. If $j_2-j_1+1<3$ (partial interval with fewer than 3 points), then the algorithm is interrupted by an error. Then, in the first instance a renumbering of the indices is undertaken (i→i–$j_1$+1), so that the algorithm can be applied to a set of data points $(x_i,y_i)$, i=1, \ldots ,n where n=$j_2$–$j_1$+1. A distinction is now to be drawn between three cases: (1) $x_1$ is an extreme point (2) $x_n$ is an extreme point and (3) $x_1$ and $x_n$ are both extreme points.

Case (1): If $x_1$ is an extreme point, then equation (2.2) reads in analogous fashion:

$$s'(x_1)=0 \text{ and } s''(x_n)=0 \quad (3.16)$$

The spline is uniquely determined with the aid of equation (3.16). However, the result is now no longer a natural spline, since the condition $s''(x_1)=0$ has been abandoned. The algorithm described in section 3.3 must be modified as follows: the iterative equation (3.9) may be written as $$s'(x_i)=c_i \cdot s''(x_1)+e_i$$

$$s''(x_i)=\check{c}_i \cdot s''(x_1)+\check{e}_i \quad (3.17)$$

The equations (3.20) are thus substituted by (3.17). In this case, the iterative equations (3.11) and (3.12) continue to be applicable for $c_i, \check{c}_i, e_i$ and $\check{e}_i$. For the initial conditions, the result is now however in comparison with the equations (3.9) and (3.17):

$c_1=0$ $e_1=s'(x_1)=0$ $\check{c}_1=1$ $$\check{e}_1=0 \quad (3.18)$$

The equations (3.13) are thus substituted by (3.18). For i=n, it emerges in this case from equation (3.17) that $$s''(x_n)=\check{c}_n \cdot s''(x_1)+\check{e}_n$$

This means that now in a similar way to equation (3.14)

$$s''(x_i) = -\frac{\check{e}_n}{\check{c}_n} \quad (3.19)$$

Case (2): If $x_n$ is an extreme point, then equation (2.2) reads in analogous fashion $$s''(x_1)=0 \text{ and } s'(x_n)=0 \quad (3.20)$$

The spline is again uniquely determined with the aid of equation (3.20). In this case also, no natural spline is obtained. The algorithm described in section 3.3 must be modified as follows: for i=n, it emerges from equation (3.10) that $$s'(x_n) = c_n \cdot s'(x_1) + e_n$$

Solving for $s'(x_1)$ gives using equation (3.20):

$$s'(x_i) = -\frac{e_n}{c_n} \quad (3.21)$$

The equation (3.14) is therefore replaced by (3.21).

Case (3): If $x_1$ and $x_n$ are extreme points, then it is demanded, in a similar way to equation (2.2) that $$s'(x_1) = 0 \text{ and } s'(x_n) = 0 \quad (3.22)$$

As in case (1), in this case also, the modified initial conditions (3.18) are applicable. For i=n, the following is obtained from equation (3.17):

$$s'(x_n) = c_n \cdot s''(x_1) + e_n$$

According to equation (3.22), $s''(x_1)$ is computed as $$s''(x_i) = -\frac{e_n}{c_n} \quad (3.23)$$

Equation (3.14) is thus replaced by (3.23).

Running of the Algorithms

In the first instance the division, described in sections 3.3 and 3.4, of the set of data points in to subsets is undertaken, to the extent that non-differentiable or respectively extreme points are present. In this case, consideration is also given to combinations, for example a subset $U = \{(x_i, y_i), i \in \tilde{M}\}$, $\tilde{M} = \{j_1, \ldots, j_2\}$ with $j_1, j_2 \in N$ can commence with the non-differentiable point $x_{j_1}$ and end with the extreme point $x_{j_2}$. Similar considerations apply to all further possible combinations.

In a second step, the algorithms described in sections 3.3 and 3.4 are applied to the subsets of the data points. To this end, for each subset the renumbering of the indices which is explained in section 3.4 is undertaken, so that the algorithms are executed in each instance for data points $(x_i, y_i)$ with i=1, ..., n where $n = j_2 - j_1 + 1$.

If an error occurs during the run, then the algorithm is interrupted.

Special Case: n=2

In this subsection, it is further to be demonstrated that the algorithm described in section 3.3 also gives reasonable results in the case n=2 (is where only 2 data points are available for the interpolation).

In this case, the algorithm reveals that $s'(x_1) = \Delta^1$ and thus $s'(x_2) = \Delta^1$. The following emerges for the coefficients: $a_{i,0} = y_1$, $a_{i,1} = \Delta^1$, $a_{i,2} = a_{i,3} = 0$. Thus, the spline reads: $s(x) = \Delta^1 \cdot (x - x_1) + Y_1$. Thus, as expected, the result is a straight line which joins the two data points $(x_1, y_1)$ and $(x_2, y_2)$.

Computation of Step Widths

The simulator can in addition to the description of the component by mathematical equations, also require details as to the matter of with what accuracy (step width) these equations are to be executed in the corresponding partial intervals. This is the case, for example, with the analog simulator SABER. A high accuracy (small step width) can be required if the function curve deviates from the linear behavior of a straight line, or a rapidly altering region of the curve (high gradient) is to be considered with greater accuracy.

In the first case, the curvature of the spline $s''(x)$ is a measure of the accuracy: high curvature requires high accuracy. The maximum of the curvature within a prescribed interval can be used as an indicative measure. This may readily be determined, since the second derivative $s''(x)$ is a linear polynomial (it is sufficient to consider the marginal values in the respective interval).

In the second case, it is possible to have recourse either to the gradient $s'(x)$ or, better, to the arc length $b(s)$, described in equation (2.6), of the spline. $b(s)$ can be used directly as an indicative measures the maximum of the gradient must be determined from the marginal values and the possibly present relative extremes (defining equation $s'(x_z) = 0$).

In the text which follows, the invention is further explained with reference to figures and illustrative embodiments.

Example of Application

Figure 1:
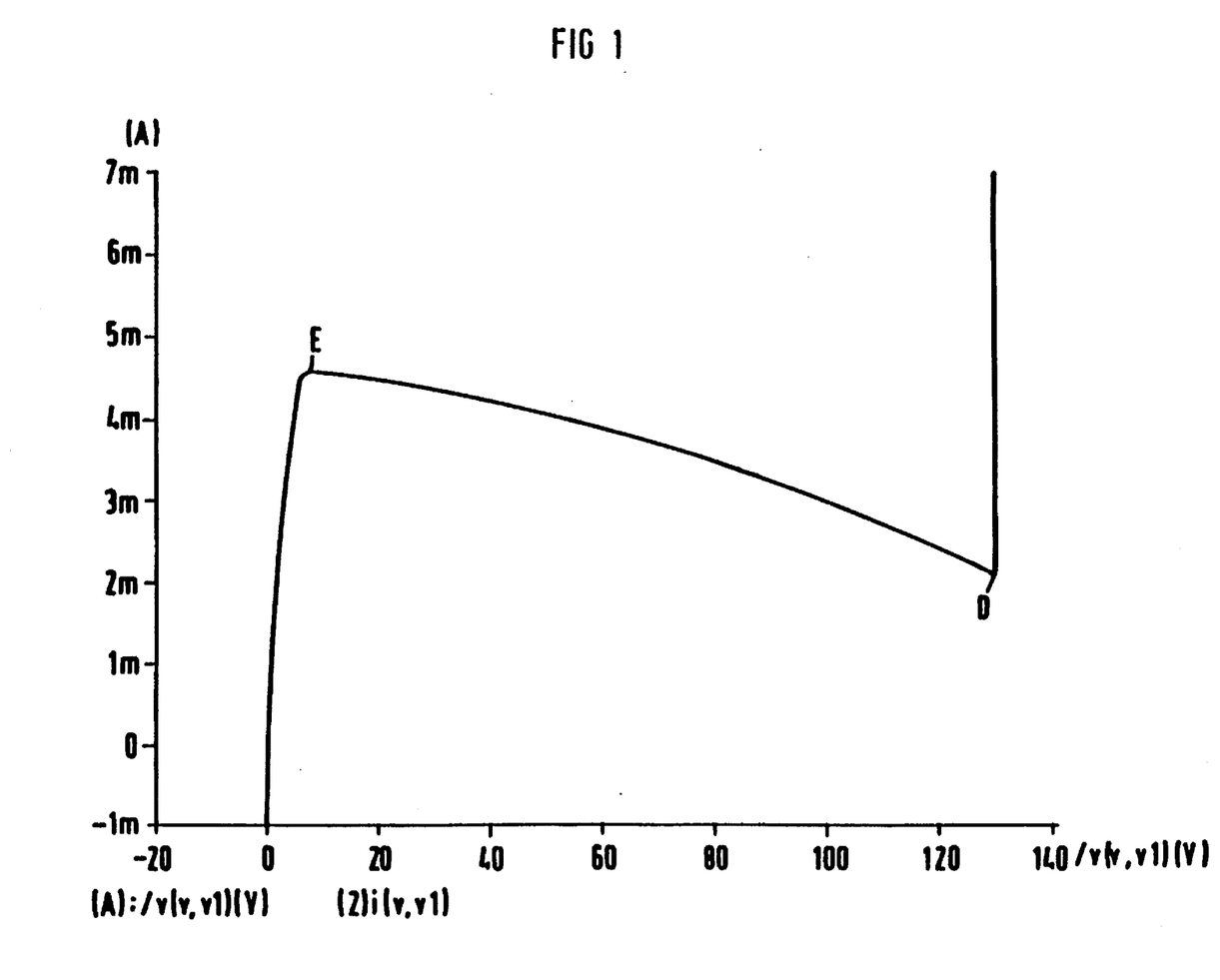
FIG. 1 shows the result of a simulation of a diode F452 using the method according to the present invention. (Current-voltage characteristic)

In this subsection, the application of our method to a specific example is to be tested. To this end, a current-limiting diode of type F452 was selected. The characteristic of the diode includes both an extreme point and also a non-differentiable point. A data sheet was available from the distributor, from which data sheet data points of the characteristic could be inferred. Table 1 shows a list of the data points as they were made available for the method as input. Simulation took place using an analog simulator (DC Transfer Analysis). FIG. 1 shows the characteristic of the diode, as obtained as the result of the simulation.

Figure 2:
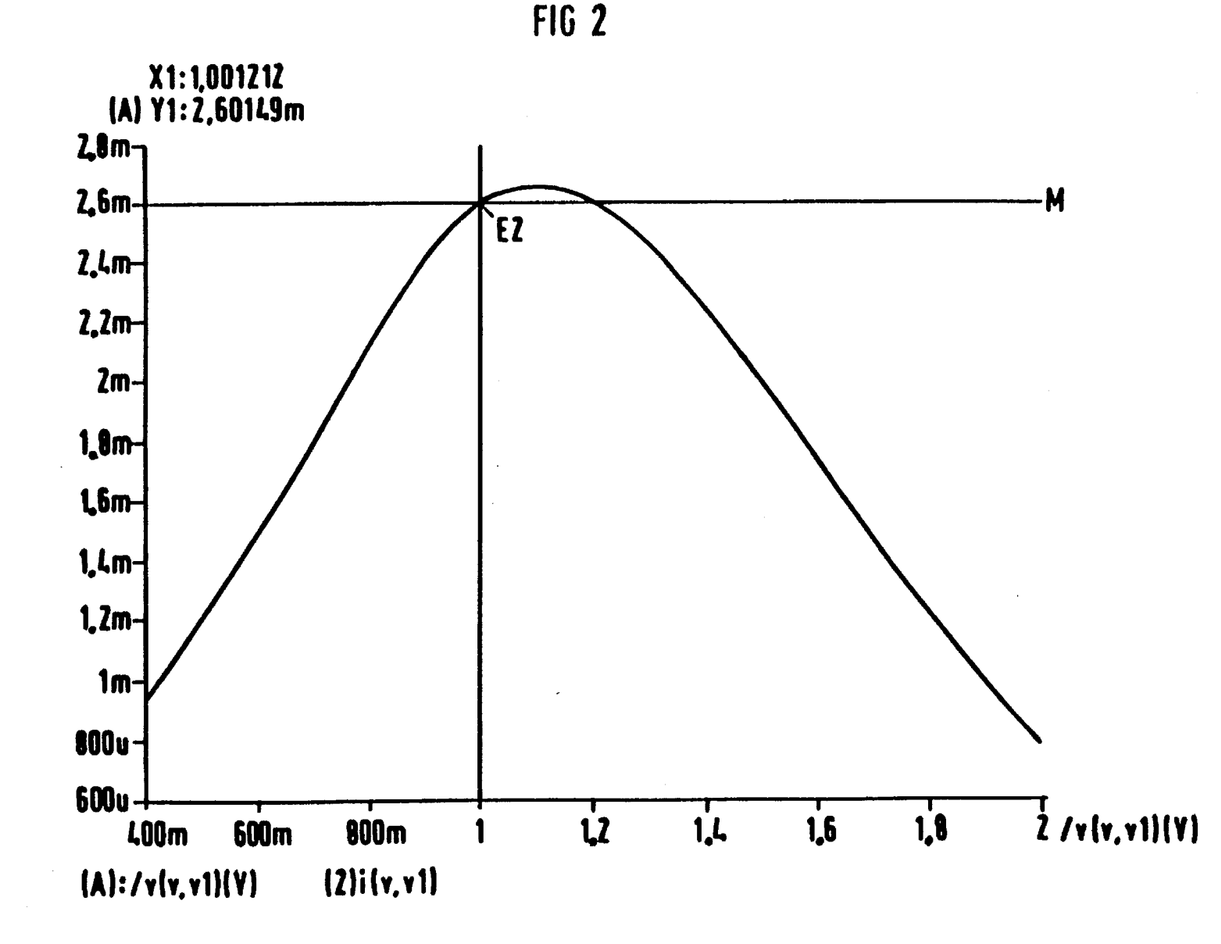
FIG. 2 shows the simulation without prescribed maximum point.
Figure 4:
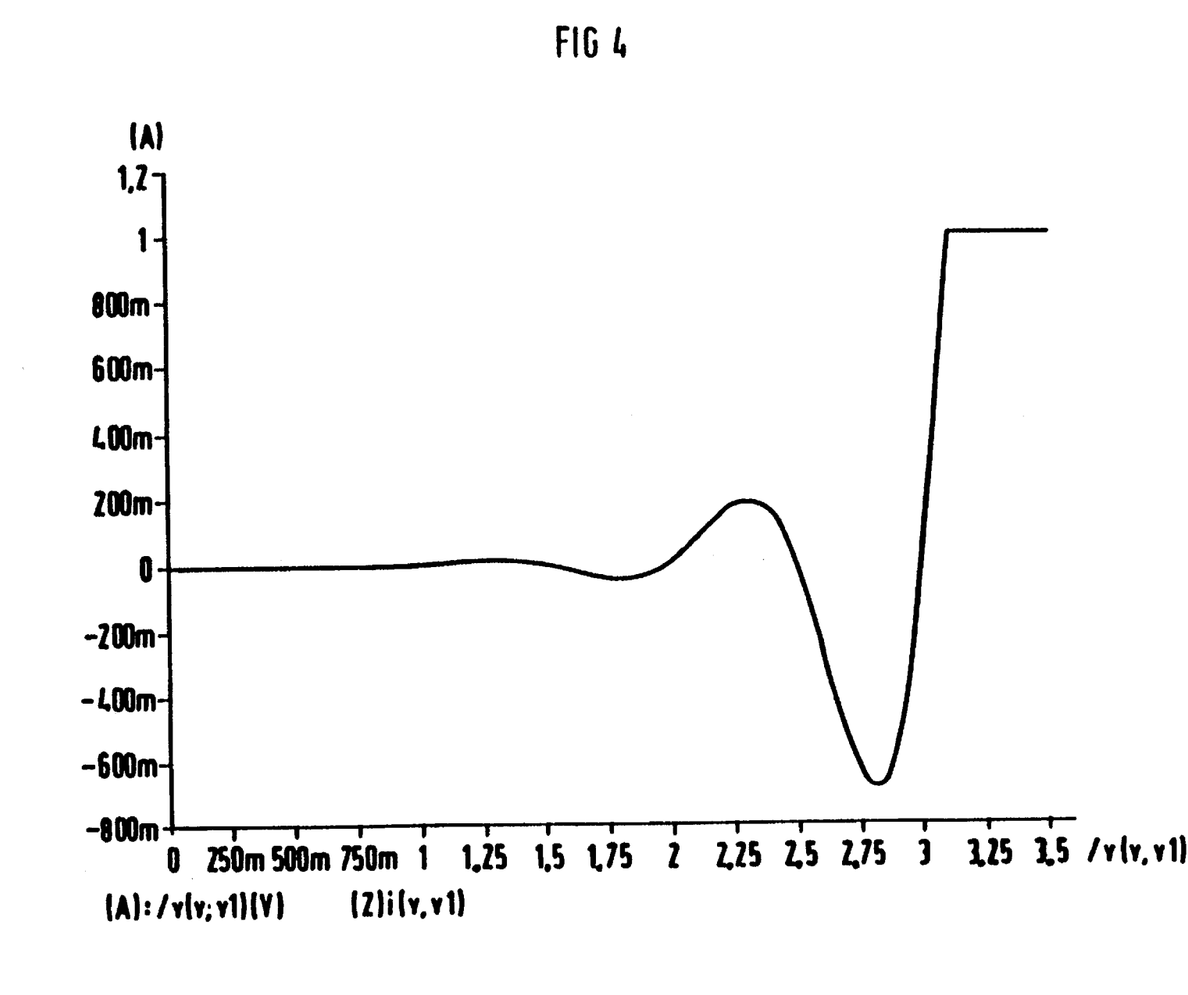
FIG. 4 shows the undesired oscillation of the spline if the breakdown voltage at 3 volts is not identified as a non-differentiable point.
Figure 5:
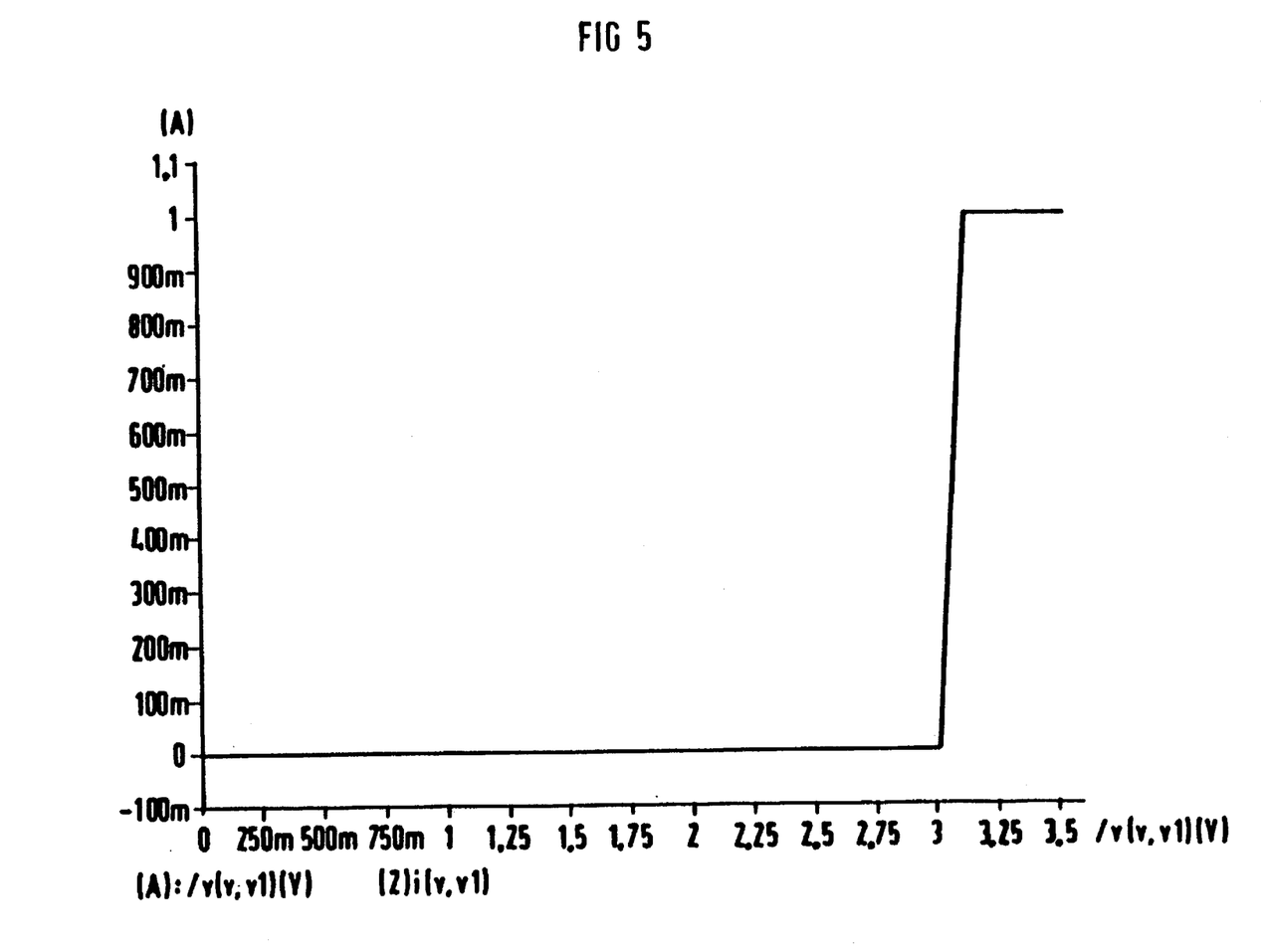
FIG. 5 shows that the problem is entirely overcome by the explicit prescription of such points.

To illustrate the effect of explicitly prescribed non-differentiable or respectively extreme points, the method was carried out with and without their explicit specification. Table 2 shows in the first instance once again a list of data points as those served as input. The maximum lies at a voltage of 1 volt. FIG. 2 shows the simulation without prescribed maximum point. It is clearly possible to see the displacement of the maximum by approximately 0.1 volt towards higher values. The result of the modeling with a prescribed extreme point is to be seen in FIG. 3: the function curve now adopts its maximum precisely at the defined value of 1 volt. The effect of non-differentiable points is represented in FIGS. 4 and 5: FIG. 4 reveals the undesired "oscillation" of the spline if the "breakdown voltage" at 3 volts is not identified as a non-differentiable point. As is seen in FIG. 5, the problem is entirely overcome by the explicit prescription of such points.

The pairs of values which form the basis of the function curves which are represented in the figures are located in the similarly designated tables.

FIG. 1 shows the result of the simulation of a diode F452 using the method according to the invention. (Current-voltage characteristic). This simulation is based on the pairs of values derived from Table 1. They are represented in simplified form for the method according to the invention. In the first instance, the representation of the pairs of values in exponential form is agreed with "scale 1e-3". A point is characterized by the designation point. The pair of values follows horizontally in the next two columns. Subsequently, an identification is specified, which communicates to the method according to the invention whether the particular characteristics are to be observed in the computation of this point. −s signifies a normal data point, −d signifies a nondifferentiable data point, and −e signifies an extreme value. It can clearly be recognized from the result of the simulation that the extreme value E is correctly reproduced at a voltage of 8 volts, and the non-differentiable point D (kink) at the voltage of 130 volts, by the method according to the invention.

FIG. 2 shows the simulation result for a component which must not exceed a maximum M at the point 1 and 2.6. The simulated result is based on the pairs of values represented in Table 2. As can clearly be seen, the point E2, which is provided as maximum in the pairs of values, is indeed in the simulation result a component part of the function curve but it is not the maximum. In the case of the simulation undertaken here, the criterion for extreme values "–e" which is provided in the method according to the invention was not used in the definition of the pairs of values. This is expressed in a displacement of the maximum in the curve progression represented.

Figure 3:
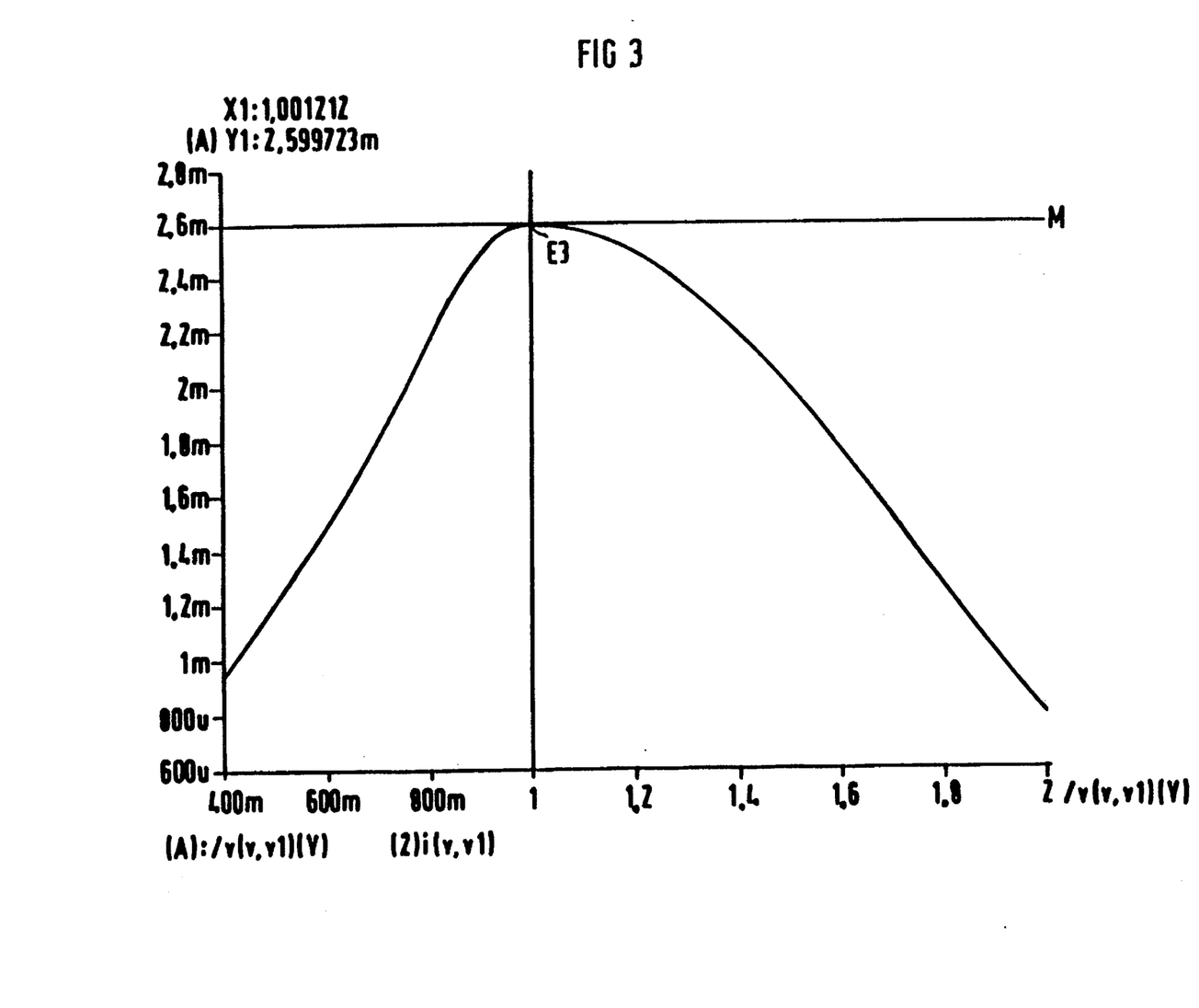
FIG. 3 shows the result of the modeling with a prescribed extreme point.

FIG. 3 shows the curve progression as it is obtained after simulation using the method according to the invention, which is based on the same family of input value pairs as FIG. 2, with the exception that the point 1 and 2.6 in Table 3 is identified as extreme value by "–e". In this case, it can clearly be recognized that the extreme value E3 has been displaced as compared with the version represented FIG. 2, and is now situated approximately at the correct position.

In FIG. 4, a component is simulated using the method according to the invention, the characteristic properties of which are represented in value pair Table 4. It is a characterizing feature of this component that its function curve exhibits a non-differentiable point (kink) at a voltage of 3 volts. For the simulation, this point was not explicitly identified by an option "–d" in Table 4. The result of the simulation clearly shows that the component is inclined to oscillate during the simulation and that the curve progression which characterizes the component is not correctly represented by the simulation.

FIG. 5 shows the result of a simulation using the method according to the invention, which simulation is based on the pairs of values derived from Table 5. Table 5 is distinguished in relation to Table 4, which was simulated in FIG. 4, only in that the point at 3 volts was now characterized as non-differentiable by the option "–d". It can clearly be recognized that the simulation using the method according to the invention now leads to a correct result, which describes characteristic properties of the component. This means that the kink at a voltage of 3 volts is correctly reproduced.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

TABLE 1 scale 1e-3

| | | | |
|---|---|---|---|
| point | −0.9 | −881. | −s |
| point | −0.6 | −302. | −s |
| point | −0.5 | −149. | −s |
| point | −0.4 | −46. | −s |
| point | −0.3 | −8.18 | −s |
| point | −0.2 | −1.1 | −s |
| point | −0.1 | −0.138 | −s |

TABLE 1-continued scale 1e-3

| | | | |
|---|---|---|---|
| point | 0. | 0. | −d |
| point | 0.5 | 0.6 | −s |
| point | 0.7 | 0.9 | −s |
| point | 1. | 1.3 | −s |
| point | 1.5 | 2. | −s |
| point | 2. | 2.5 | −s |
| point | 3. | 3.3 | −s |
| point | 4. | 3.8 | −s |
| point | 5. | 4.2 | −s |
| point | 7. | 4.38 | −s |
| point | 8. | 4.4 | −e |
| point | 8.1 | 4.4 | −s |
| point | 10. | 4.39 | −s |
| point | 130. | 2.5 | −d |
| point | 131. | 1000. | −s |

TABLE 2 scale 1e-3

| | | | |
|---|---|---|---|
| point | 0. | 0. | −s |
| point | 0.5 | 1.2 | −s |
| point | 0.7 | 1.8 | −s |
| point | 1. | 2.6 | −s |
| point | 1.5 | 2.0 | −s |
| point | 2. | 0.8 | −s |
| point | 3. | 0.0 | −s |

TABLE 3 scale 1e-3

| | | | |
|---|---|---|---|
| point | 0. | 0. | −s |
| point | 0.5 | 1.2 | −s |
| point | 0.7 | 1.8 | −s |
| point | 1. | 2.6 | −e |
| point | 1.5 | 2.0 | −s |
| point | 2. | 0.8 | −s |
| point | 3. | 0.0 | −s |

TABLE 4 scale 1e-3

| | | | |
|---|---|---|---|
| point | 0. | 0. | −s |
| point | 0.5 | 0.1 | −s |
| point | 1.0 | 0.2 | −s |
| point | 1.5 | 0.4 | −s |
| point | 2. | 0.6 | −s |
| point | 2.5 | 0.9 | −s |
| point | 3. | 1.2 | −s |
| point | 3.1 | 1000.0 | −s |

TABLE 5 scale 1e-3

| | | | |
|---|---|---|---|
| point | 0. | 0. | −s |
| point | 0.5 | 0.1 | −s |
| point | 1.0 | 0.2 | −s |
| point | 1.5 | 0.4 | −s |
| point | 2. | 0.6 | −s |
| point | 2.5 | 0.9 | −s |
| point | 3. | 1.2 | −d |
| point | 3.1 | 1000.0 | −s | old version

REFERENCES

[1] H. Spiro: Simulation of Integrated Circuits by Universal Computer Programs, R. Oldenbourg Verlag GmbH, Munich, 1985.

[2] H. Wiedemann (Racal Redac Design System GmbH): Superordinate Aspects in the ASIC Design in: Meeting Reports SMT/ASIC/Hybrid '91, 5th International Trade Fair and Congress, VDE Verlag, Berlin, 1991.

[3] H. Stump (Logic Modeling Systems Incorporated): Trends in Technology and EDA for the 1990s, in: Conference Record Electro/90, Ventura, USA, 1990.

B. Tuck: What Do Digital Designers Need to Master the Art of Analog Design, in: Comput. Des. 30 11, 1991.

What is claimed is:

1. A method for simulating at least one component, whose characterizing features are described by a set of pairs of values (A, V) by means of a simulator on a computer, the method comprising the steps of:

a) finding, in a first step, a function (s) by spline interpolation for all pairs of values (A, V) which function allocates in each instance to one value (A, V) of each respective pair of values the other value (V, A) of the pair of values;

b) using in the simulator, in a second step, the function to determine arbitrarily selectable pairs of values (A, V) for the component;

c) generating a non-differentiable point (D) in a progression of the function in that the set of pairs of values is subdivided in to two subsets, in which the point is included;

d) carrying out the spline interpolation for each subset of the two subsets, the point being used on one occasion as an upper interval bound and on the other occasion as a lower interval bound related to the two subsets for the spline interpolation.

2. A method for simulating at least one component, whose characterizing features are described by a set of pairs of values (A, V), by means of a simulator on a computer, the method comprising the steps of:

a) finding in a first step, a function (s) by spline interpolation for all pairs of values (A, V) which function allocates in each instance to one value (A, V) of each respective pair of values the other value (V, A) of the pair of values;

b) using for the spline interpolation a cubic spline function of the form:

$$s(x)=a_{i,3}(x-x_i)^3+a_{i,2}(x-x_i)^2+a_{i,1}(x-x_i)+a_{i,0}$$

with pairs of values $(x_i, y_i)$, $i=1,\ldots,n$ where $n \in N$ which are sorted in ascending sequence according to a magnitude of $x_i$ and form the interval bounds of partial intervals for the spline interpolation;

c) determining coefficients $a_{i,3}, a_{i,2}, a_{i,1}, a_{i,0}$ for each partial interval as:

$$a_{i,3} = \frac{s''(x_{i+1}) - s''(x_i)}{6 \cdot (x_{i+1} - x_i)}$$

with recursion formulae $$s'(x_{i+1}) = 3 \cdot \Delta^i - 1/2 s''(x_i) \cdot \Delta_x^i - 2 \cdot s'(x_i)$$

$$s''(x_{i+1}) = 6 \frac{\Delta^i}{\Delta_x^i} - 2 \cdot s''(x_i) - 6 \frac{s'(x_i)}{\Delta_x^i}$$

$$\Delta_x^i := x_{i+1} - x_i$$
   $$\Delta_y^i := y_{i+1} - y_i$$

$$\Delta_i := \frac{\Delta_y^i}{\Delta_x^i}$$

with the use of $$s'(x_i) = c_i \cdot s'(x_1) + e_i$$

$$s''(x_i) = \check{c}_i \cdot s'(x_1) + \check{e}_i$$

$$c_{i+1} = \frac{1}{2} \Delta_x^i \cdot \check{c}_i - 2 \cdot c_i$$

$$e_{i+1} = 3 \cdot \Delta^i - \frac{1}{2} \Delta_x^i \cdot \check{e}_i - 2 \cdot e_i$$

$$\check{c}_{i+1} = -2 \cdot \check{c}_i - 6 \frac{c_i}{\Delta_x^i}$$

$$\check{e}_{i+1} = 6 \frac{\Delta^i}{\Delta_x^i} - 2 \cdot \check{e}_i - 6 \frac{e_i}{\Delta_x^i}$$

initial conditions for natural splines $c_1 = 1$ $e_1 = 0$ $\check{c}_1 = 0$ $\check{e}_1 = s''(x_1) = 0$ as well as boundary conditions for natural splines $s''(x_1) = 0$ and $s''(x_n) = 0$ and derivative determined therefrom $$s'(x_1) = -\frac{\check{e}_n}{\check{c}_n}$$

Index " ' " signifies 1st derivative
   Index " '' " signifies 2nd derivative; and d) using in the simulator, in a second step, the function to determine arbitrarily selectable pairs of values (A, V) for the component.

3. The method as claimed in claim 2, wherein the method further comprises:

a) generating a non-differentiable point (D) in a progression of the function in that the set of pairs of values is subdivided into two subsets in which the point is included; and b) carrying out the spline interpolation for each subset of the two subsets, the point being used on one occasion as an upper interval bound and on the other occasion as a lower interval bound related to the two subsets for the spline interpolation.

4. The method as claimed in claim 2, wherein extreme points (E) are prescribed for the function, in that the coefficients a are determined using a common recursion formulae in the following manner:

a) for $x_1$ as extreme point with the use of:

$$s'(x_i) = c_i \cdot s''(x_1) + e_i$$

$$s''(x_i) = \check{c}_i \cdot s''(x_1) + \check{e}_i$$

as well as extreme value conditions $$s'(x_1)=0 \text{ and } s''(x_n)=0$$

and initial conditions $$c_1=0$$
$$e_1=s'(x_1)=0$$
$$\check{c}_1=1$$
$$\check{e}_1=0$$

and 2nd derivative determined therefrom $$s''(x_1) = -\frac{\check{e}_n}{\check{c}_n}$$

b) for $x_n$ as extreme point, with the use of:

$$s'(x_n)=c_n s'(x_1)+e_n$$

as well as extreme value conditions:

$$s''(x_1)=0 \text{ and } s'(x_n)=0$$

and derivative determined therefrom $$s'(x_1) = -\frac{e_n}{c_n}$$

c) for $x_1$ and $x_n$ as extreme points, with the use of $$s'(x_1)=c_n s''(x_1)+e_n$$

as well as extreme value conditions $$s'(x_1)=0 \text{ and } s'(x_n)=0$$

initial conditions $$c_1=0$$
$$e_1=s'(x_1)=0$$
$$\check{c}_1=1$$
$$\check{e}_1=0$$

and 2nd derivative determined therefrom $$s''(x_1) = -\frac{e_n}{c_n}$$

\* \* \* \* \*